(12) United States Patent
Lo et al.

(10) Patent No.: US 8,779,887 B2
(45) Date of Patent: Jul. 15, 2014

(54) CURRENT SENSING RESISTOR

(75) Inventors: Ta-Wen Lo, Keelung (TW); Yen-Ting Lin, Taichung (TW)

(73) Assignee: Cyntec Co., Ltd., Hsinchu (TW)

( * ) Notice: Subject to any disclaimer, the term of this patent is extended or adjusted under 35 U.S.C. 154(b) by 223 days.

(21) Appl. No.: 13/452,265

(22) Filed: Apr. 20, 2012

(65) Prior Publication Data

US 2012/0200383 A1 Aug. 9, 2012

Related U.S. Application Data

(63) Continuation-in-part of application No. 12/779,656, filed on May 13, 2010, now Pat. No. 8,183,976.

(51) Int. Cl.
*H01C 1/012* (2006.01)
*H01C 7/13* (2006.01)

(52) U.S. Cl.
CPC .................................. *H01C 7/13* (2013.01)
USPC .............. 338/314; 338/20; 338/309; 338/320

(58) Field of Classification Search
CPC ........... H01C 7/13; H01C 7/001; H01C 1/142
USPC ............ 338/20, 309, 314, 320, 328, 330, 332
See application file for complete search history.

(56) References Cited

U.S. PATENT DOCUMENTS

| | | | |
|---|---|---|---|
| 4,772,520 A * | 9/1988 | Takeno et al. | 428/698 |
| 5,287,083 A | 2/1994 | Person et al. | |
| 5,604,477 A | 2/1997 | Rainer et al. | |
| 6,794,985 B2 | 9/2004 | Nakamura et al. | |
| RE39,660 E | 5/2007 | Szwarc et al. | |
| 8,183,976 B2 * | 5/2012 | Lo et al. | 338/314 |
| 8,531,264 B2 * | 9/2013 | Li et al. | 338/333 |
| 8,558,656 B2 * | 10/2013 | Wang et al. | 338/22 R |
| 2006/0220740 A1 | 10/2006 | Bessho et al. | |
| 2011/0057764 A1 | 3/2011 | Smith et al. | |
| 2012/0200383 A1 * | 8/2012 | Lo et al. | 338/314 |

FOREIGN PATENT DOCUMENTS

| | | |
|---|---|---|
| TW | 200636763 | 10/2006 |
| TW | 200830333 | 7/2008 |

* cited by examiner

*Primary Examiner* — James Harvey
(74) *Attorney, Agent, or Firm* — Kirton McConkie; Evan R. Witt

(57) ABSTRACT

A resistor device includes a resistor plate and an electrode structure. The electrode structure includes an electrode layer and an auxiliary layer. The electrode layer is disposed at a first face of the resistor plate and includes a first portion and a second portion overlying a first side and a second side of the resistor plate, respectively, and a current path is conducted between the first portion and the second portion through the resistor plate. The auxiliary layer is disposed at a second face of the resistor plate and includes at least a first block and a second block overlying the first side of the resistor plate, and at least a third block overlying the second side of the resistor plate, wherein the first, second and third blocks of the auxiliary layer are separated from one another so that any current flow among the blocks is blocked.

15 Claims, 14 Drawing Sheets

CURRENT SENSING RESISTOR

CROSS-REFERENCE TO RELATED APPLICATIONS

The present application is a continuation-in-part application claiming benefit from a parent U.S. patent application Ser. No. 12/779,656 and filed May 13, 2010, contents of which are incorporated herein for reference.

FIELD OF THE INVENTION

The present invention relates to a resistor device, and more particularly to a resistor device adapted to current sensing.

BACKGROUND OF THE INVENTION

A current sensing resistor, when serially connected to a load and applied current thereto, results in a voltage drop which may be measured and referred to estimate the current intensity. Since the resistance of a current sensing resistor is generally at a milliohm (mOhm) order, high resistance precision, e.g. with deviation within ±1%, is required compared to a common resistor. Accordingly, proper adjustment is generally performed in the manufacturing process of the current sensing resistor after measuring resistance of the newly produced resistor and calculating deviation of the measured resistance from a preset ideal value. Repetitive measurement and adjustment are performed until the measured resistance is close enough to the preset ideal value.

Conventionally, Kelvin measurement, which is a four-point type of measurement, is adopted to measure resistance of a current sensing resistor. The principle will be described hereinafter.

Please refer to FIG. 1, which schematically illustrates circuitry associated with Kelvin measurement. As shown, two ends of a resistor 15 whose resistance R is to be measured are respectively connected to four points 11, 12, 13 and 14. The points 13 and 14 are further respectively connected to head and tail ends of a constant current source 16 which supplies a constant current intensity I. On the other hand, the points 11 and 12 are coupled to respective probes with high impedance for measuring voltage difference therebetween. Since the input impedance of the probes coupled to the points 11 and 12 is relative high, it is assumed that no current would pass through point 11, resistor 15 and point 12, i.e. $i_1=0$, $i_2=0$. Under this circumstance, the constant current source 16, point 14, resistor 15 and point 13 form a circuit loop, and the voltage difference V between the points 11 and 12, where $V=V_{11}-V_{12}$, can be measured and used for calculating resistance of the resistor 15 based on Ohm's Law, i.e. V=IR.

FIG. 2A illustrates a structure of a conventional current sensing resistor. The current sensing resistor 100 includes a resistor plate 120 and two electrode plates 110 and 130 respectively welded to opposite sides of the resistor plate 120 and having apertures 140 and 150. On the electrode plates, sensing pads 111 and 113 and current pads 112 and 132 are defined as measuring area. When producing the current sensing resistor 100, a constant current I is applied between the current pads 112 and 132, and a voltage difference rendered between the sensing pads 111 and 131 ($V_{diff}=V_{111}-V_{131}$) when the constant current I passes through the current sensing resistor 100 is measured. Accordingly, resistance R1 of the resistor 120 can be calculated as $R1=V_{diff}/I$.

Please refer to FIG. 2B, which illustrates four measurement points defined in a measuring apparatus for measuring resistance of a newly produced resistor. The four measurement points 211, 212, 213 and 214 are arranged on the electrode plate in zones 311, 312, 313 and 314 as a rectangle, as shown in FIG. 2C, wherein the measurement points 213 and 214 are associated with constant current input and the measurement points 211 and 212 are associated with output voltage measurement.

The newly produced resistor is then performed with a barrel plating process to be electroplated with a soldering layer for facilitating the mounting of the resistor onto a printed circuit board (PCB).

Since the soldering layer is applied onto the resistor after the measurement and adjustment of the resistance of the resistor has been accomplished, the resistor product suffers from resistance deviation due to the newly applied soldering layer. Furthermore, the resistors produced in a batch would have diverse resistance. For example, as illustrated in FIG. 3A, the resistance of resistors produced in a batch before the soldering layer is applied is generally distributed within a narrow range, e.g. ±0.8% from the peak value. However, after the soldering layer is applied, the resistance of the resistors becomes diverse as distributed within a wide range, e.g. ±3% from the peak value, as illustrated in FIG. 3B. Thus the requirement on high resistance precision cannot be complied with.

SUMMARY OF THE INVENTION

The present invention provides a current sensing resistor, which has improved consistent resistance before and after a soldering layer is applied.

The present invention provides a resistor device, which includes a resistor plate and an electrode structure. The electrode structure includes an electrode layer and an auxiliary layer. The electrode layer is disposed at a first face of the resistor plate and includes a first portion and a second portion overlying a first side and a second side of the resistor plate, respectively, wherein the second side is opposite to the first side, and a current path is conducted between the first portion and the second portion through the resistor plate. The auxiliary layer is disposed at a second face of the resistor plate, which is opposite to the first face, and includes at least a first block and a second block overlying the first side of the resistor plate, and at least a third block overlying the second side of the resistor plate, wherein the first, second and third blocks of the auxiliary layer are separated from one another so that any current flow among the blocks is blocked.

Preferably, the resistor device further includes a soldering layer overlying the electrode layer and the auxiliary layer, and partially covering a third face of the resistor plate.

Preferably, the resistor device further includes a protective layer filling the space between the first portion and the second portion of the electrode layer and among the first, second and third blocks of the auxiliary layer.

BRIEF DESCRIPTION OF THE DRAWINGS

The above contents of the present invention will become more readily apparent to those ordinarily skilled in the art after reviewing the following detailed description and accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1:
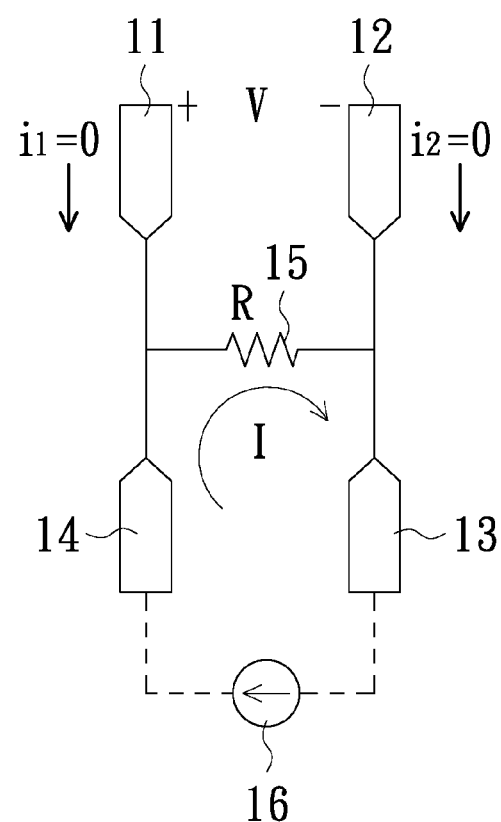
FIG. 1 is a schematic circuit diagram illustrating Kevin measurement.
Figure 2A:
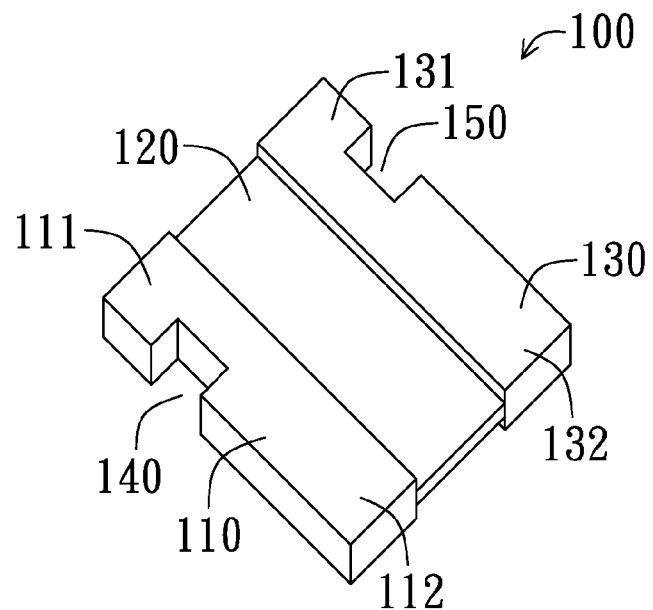
FIG. 2A is a schematic diagram illustrating a structure of a current sensing resistor according to prior art.
Figure 2B:
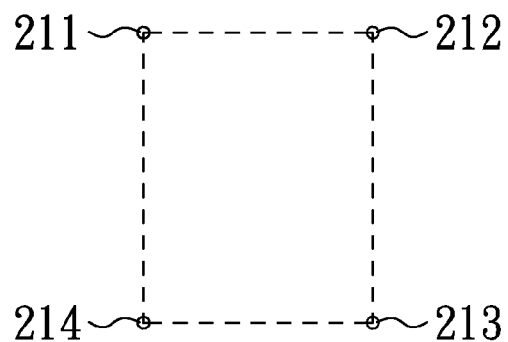
FIG. 2B is a schematic diagram illustrating four measurement points used for measuring resistance by a measuring apparatus in a production line of resistors.
Figure 2C:
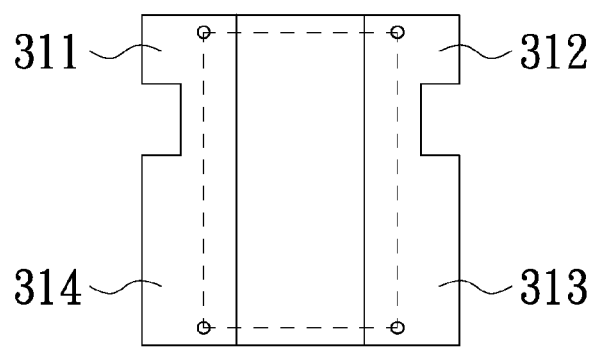
FIG. 2C is a schematic diagram illustrating the distribution of four measurement points on a resistor plate.
Figure 3A:
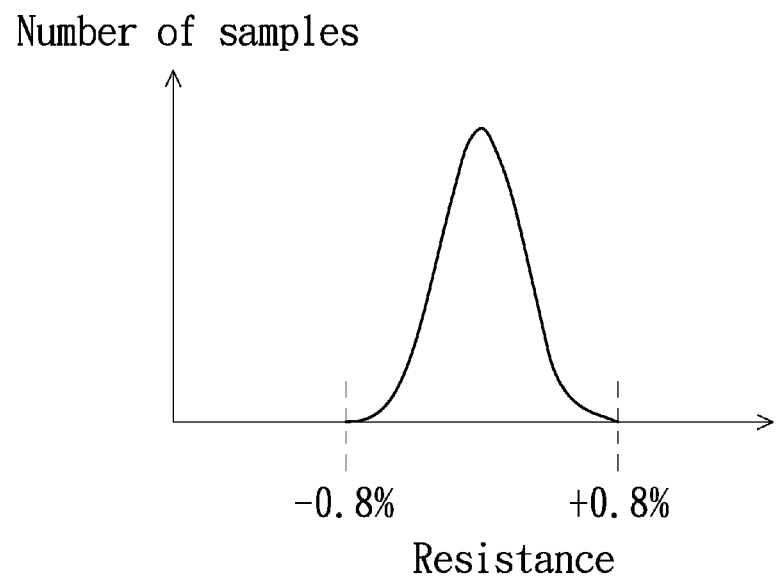
FIG. 3A and FIG. 3B are plots respectively illustrating the distribution of resistance of resistors produced in a batch before and after a soldered layer is applied according to prior art.
Figure 3B:
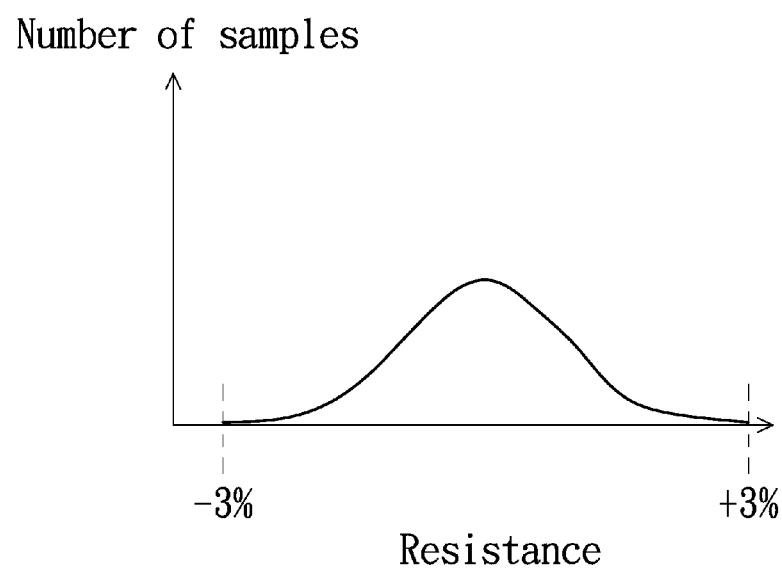
Figure 4A:
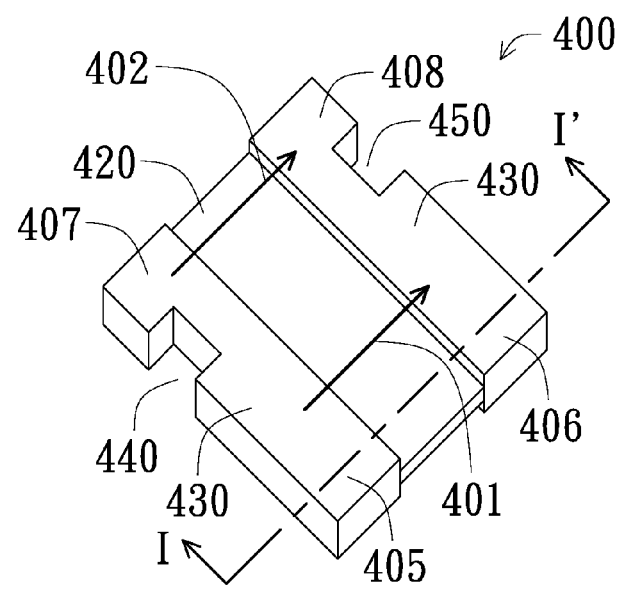
FIG. 4A is a perspective view schematically illustrating a resistor device according to a first embodiment of the present invention.
Figure 4B:
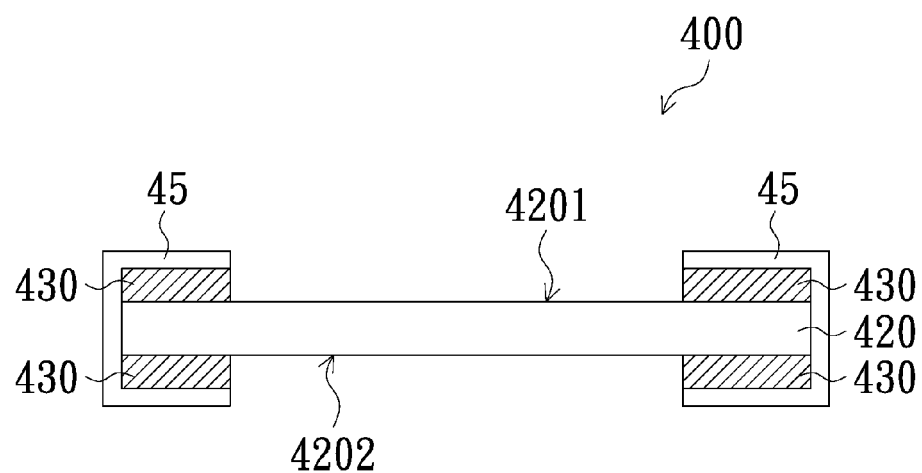
FIG. 4B is a schematic cross-sectional view of the resistor device taken along I-I' line of FIG. 4A.
Figure 4C:
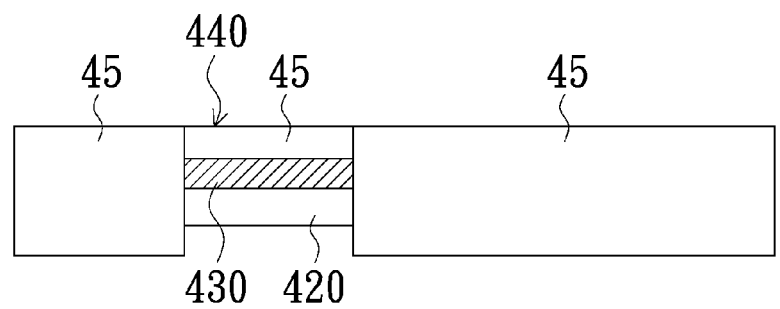
FIG. 4C is a schematic side view of the resistor device as shown in FIG. 4A.

A current sensing resistor device according to an embodiment of the present invention is illustrated in a schematic prospective view as shown in FIG. 4A, a schematic cross-sectional view as shown in FIG. 4B, which is taken along a I-I' line of FIG. 4A, and a schematic side view, as shown in FIG. 4C.

As shown in FIGS. 4A and 4B, the current sensing resistor 400 includes a resistor plate 420 and an electrode structure 430. The resistor plate 420 is created with openings at opposite sides thereof, and the electrode structure 430 is provided in a stack form onto the resistor plate 420 by way of, for example, welding or electroplating. Apertures 440 and 450 are thus formed at opposite sides of the resistor. The electrode structure 430 partially covers a face 4201 and an opposite face 4202 of the resistor plate 420. The portion of the electrode structure 430 partially covering the face 4201 is an electrode layer to be coupled to a printed circuit board (PCB) (not shown), and defined with current pads 405 and 406 and sensing pads 407 and 408 as measuring area. The resulting current sensing resistor 400 has a main current path 401 passing through the current pads 405 and 406 via the resistor plate 420, and a sensing current path 402 passing through the sensing pads 407 and 408 via the resistor plate 420. On the other hand, the portion of the electrode structure 430 partially covering the face 4202 is an auxiliary layer and defined with four separate blocks 415, 416, 417 and 418, which function for strengthening the entire resistor device and preventing from warp. A soldering layer 45 is then formed on the resulting structure. For simplicity, the details of the resulting structure in the apertures are not clearly shown in FIG. 4A, but it can be seen from FIG. 4C that the electrode structure 430 and the resistor plate 420 in the aperture 440 are exposed from the soldering layer 45. Likewise, the electrode structure 430 and the resistor plate 420 in the aperture 450 are also exposed from the soldering layer 45.

Figure 4D:
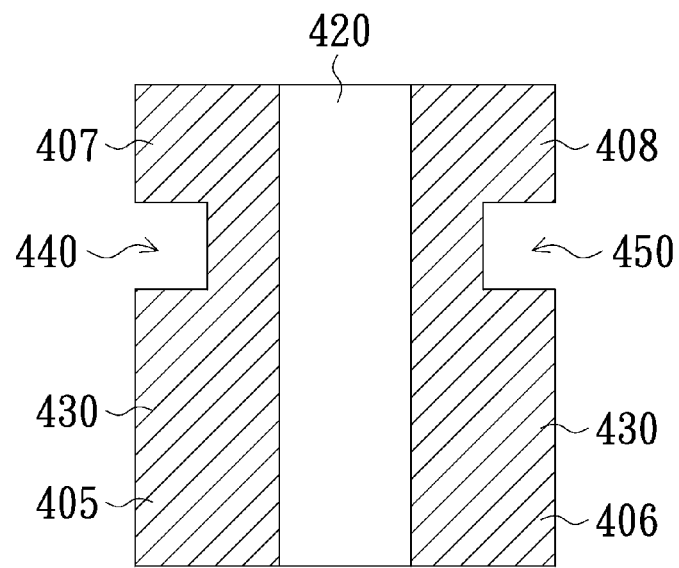
FIG. 4D is a top plane view schematically illustrating a partial structure of the resistor device as shown in FIG. 4A, before the soldering layer is applied.
Figure 4E:
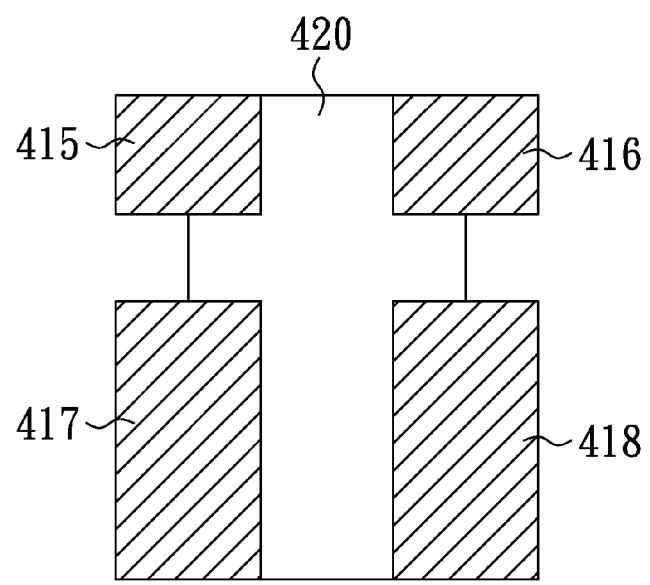
FIG. 4E is a bottom plane view schematically illustrating a partial structure of the resistor device as shown in FIG. 4A, before the soldering layer is applied.

Hereinafter, the configuration of the electrode structure 430 relative to the resistor plate 420 is illustrated with reference to the top plane view of FIG. 4D and the bottom plane view of FIG. 4E. As shown in FIG. 4D, there are physical connections among the current pads 405, 406 and sensing pads 407, 408 of the electrode structure 430 on the face 4201 of the resistor plate 420 for implementing the Kelvin measurement. On the other hand, the four auxiliary blocks 415, 416, 417 and 418 on the face 4202 of the resistor plate 420 are separate from one another, as shown in FIG. 4E. The isolation of the auxiliary blocks 415, 416, 417 and 418 is particularly made to avoid the Kevin measurement from being interfered by the undesired current flows among those blocks.

Figure 5A:
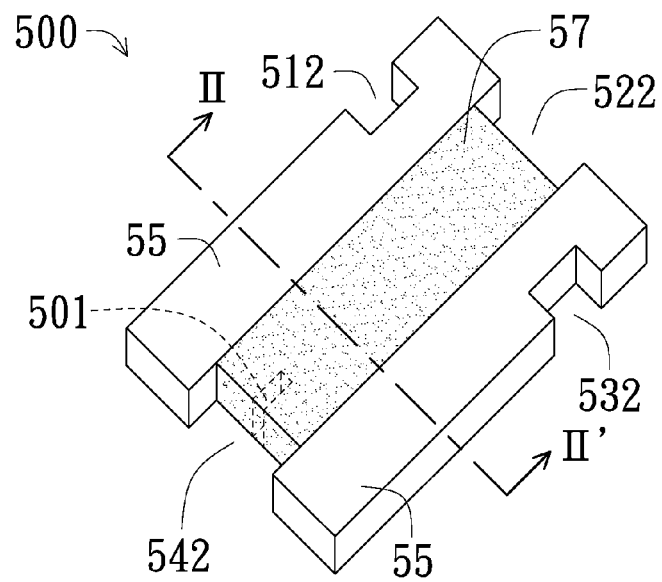
FIG. 5A is a perspective view schematically illustrating a resistor device according to a second embodiment of the present invention.
Figure 5B:
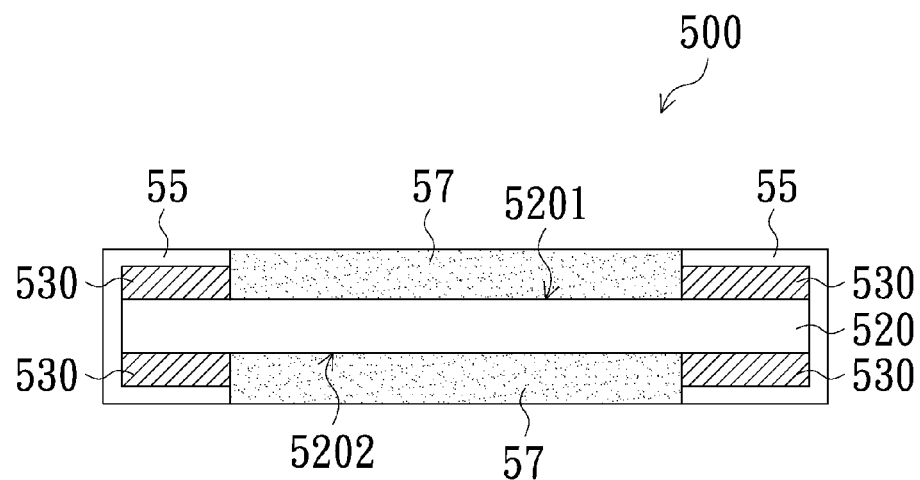
FIG. 5B is a schematic cross-sectional view of the resistor device taken along II-II' line of FIG. 5A.
Figure 5C:
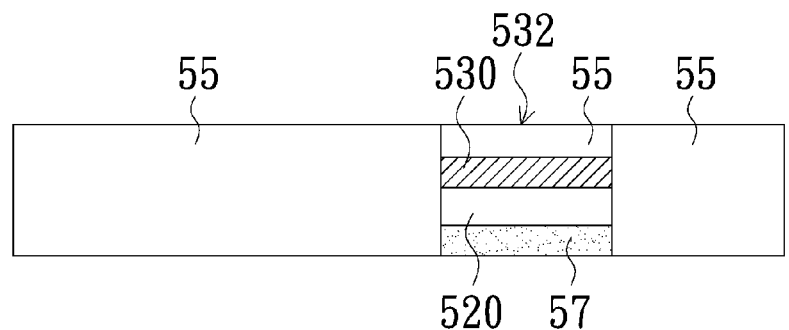
FIG. 5C is a schematic side view of the resistor device as shown in FIG. 5A.

A resistor device according to another embodiment of the present invention is illustrated with reference to FIGS. 5A and 5B, wherein FIG. 5A is a schematic perspective view, FIG. 5B is a schematic cross-sectional view, which is taken along a II-II' line of FIG. 5A, and a schematic side view as shown in FIG. 5C.

Please refer to FIG. 5A and FIG. 5B. In this embodiment, the current sensing resistor 500 includes a resistor plate 520, and an electrode structure 530. A first aperture 512, a second aperture 522, a third aperture 532 and a fourth aperture 542 are arranged at four sides of the resistor for positioning purpose, as described in the parent application. In addition, a slit 501 is created into the bottom of the aperture 542 by way of laser cutting. Since the resistance of the resistor will vary with the length of the slit 501, the size of the slit 501 is determined according to the resistance level to be reached. The positions and sizes of the apertures should be well selected so as to reach a target value of resistance with minimized measurement and adjustment repetitions. The provision of the apertures and slit facilitates to fine-tune the resistance of the resistor by simply modifying the configuration of the resistor plate.

The electrode structure 530 is provided in a stack form onto the resistor plate 520 by way of, for example, welding or electroplating. The electrode structure 530 partially covers a face 5201 and an opposite face 5202 of the resistor plate 520. A protective layer 57 is then formed on the surfaces of the resistor plate 520 uncovered by the electrode structure 530, and a soldering layer 55 is formed as overlying the electrode structure 530.

Figure 5D:
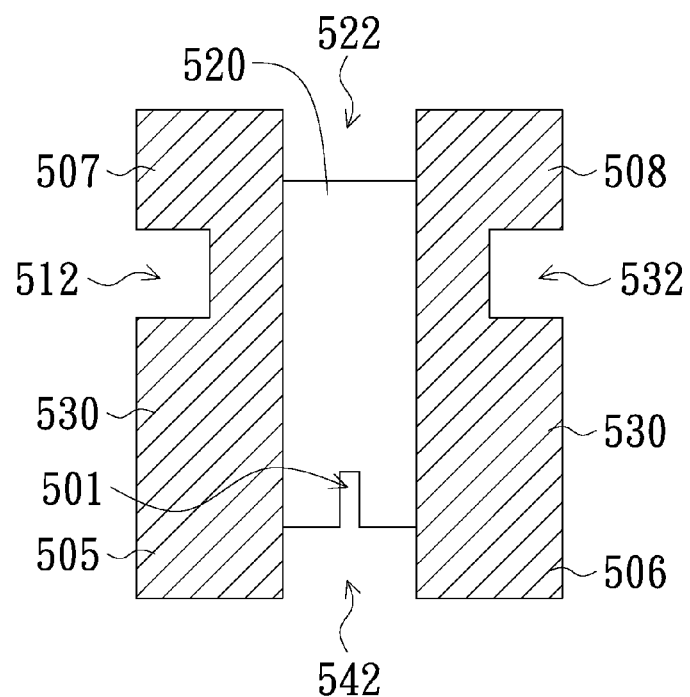
FIG. 5D is a top plane view schematically illustrating a partial structure of the resistor device as shown in FIG. 5A, before the soldering layer is applied.
Figure 5E:
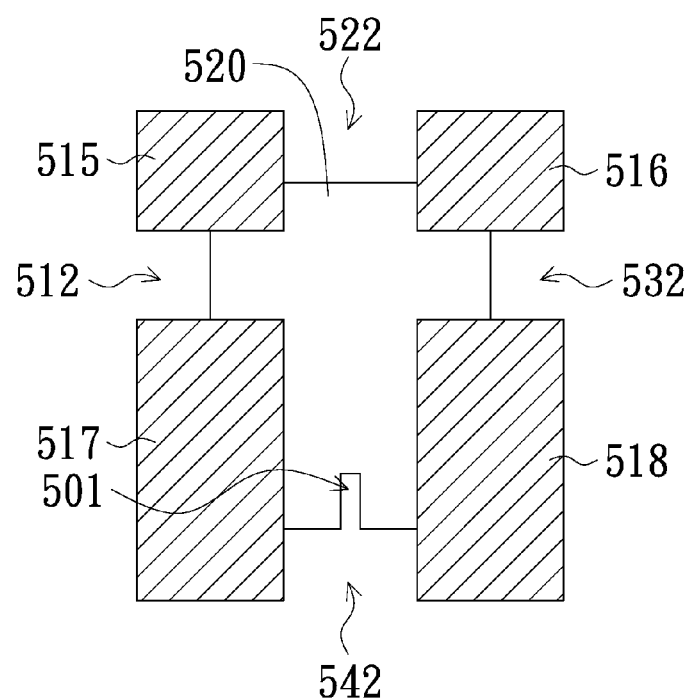
FIG. 5E is a bottom plane view schematically illustrating a partial structure of the resistor device as shown in FIG. 5A, before the soldering layer is applied.

Furthermore, it can be seen from FIG. 5C that the electrode structure 530, the resistor plate 520 and the protective layer 57 in the aperture 532 are exposed from the soldering layer 55. Likewise, the electrode structure 530, the resistor plate 520 and the protective layer 57 in the aperture 512 are also exposed from the soldering layer 55. Similar to the embodiment described with reference to FIGS. 4A-4E, current pads 505, 506 and sensing pads 507, 508 of the electrode structure 530 are physically interconnected, as illustrated in FIG. 5D, for the Kelvin measurement, and the auxiliary blocks 515, 516, 517 and 518 functioning for strengthening the resistor and preventing the resistor from warping are particularly made isolated, as illustrated in FIG. 5E, to avoid the Kevin measurement from being interfered due to undesired current flows among those blocks.

Figure 6A:
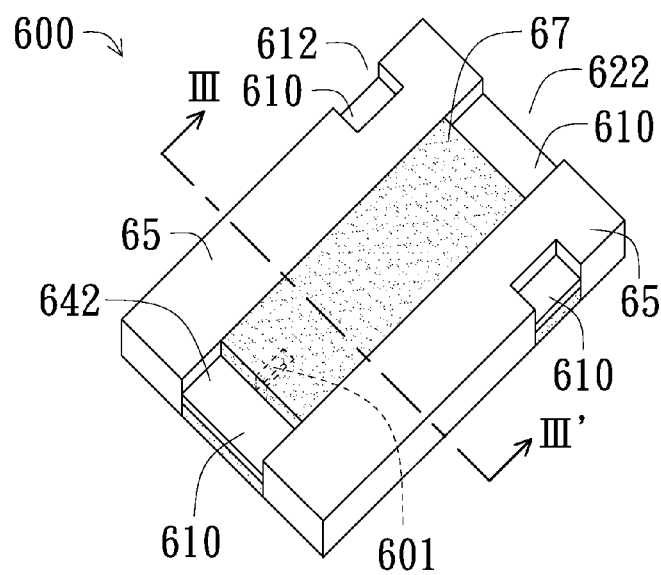
FIG. 6A is a perspective view schematically illustrating a resistor device according to a third embodiment of the present invention.
Figure 6B:
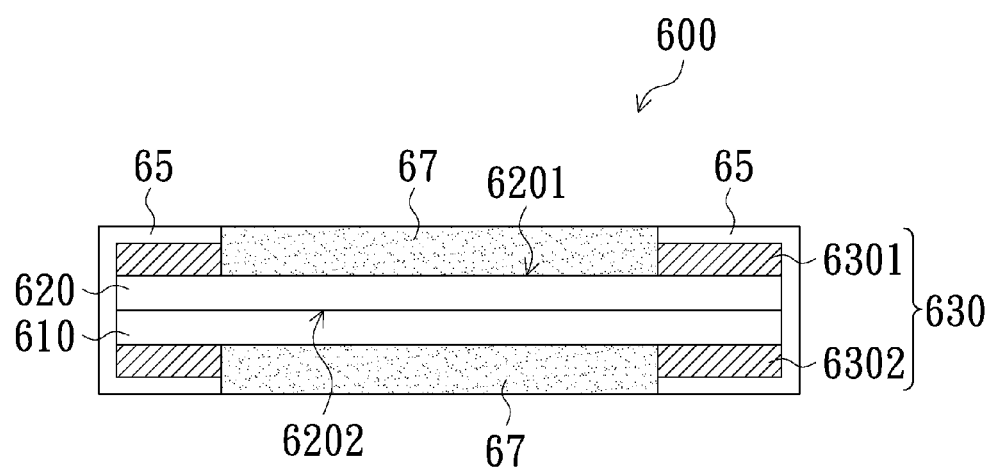
FIG. 6B is a schematic cross-sectional view of the resistor device taken along III-III' line of FIG. 6A.
Figure 6C:
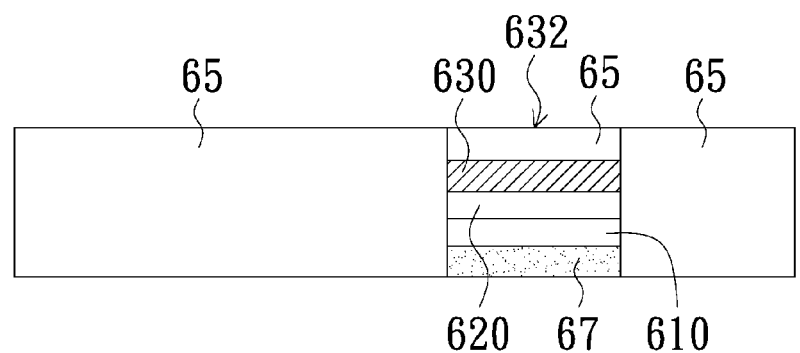
FIG. 6C is a schematic side view of the resistor device as shown in FIG. 6A.

A further embodiment of a resistor device according to the present invention is illustrated with reference to FIGS. 6A and 6B, wherein FIG. 6A is a schematic perspective view, FIG. 6B is a schematic cross-sectional view, which is taken along a III-III' line of FIG. 6A, and a schematic side view as shown in FIG. 6C.

Please refer to FIG. 6A and FIG. 6B. In this embodiment, the manufacturing of the current sensing resistor involves a laminating process, and the current sensing resistor 600 includes a carrier plate 610, a resistor plate 620, and an electrode plate 630. For example, the carrier plate 610 can be made of ceramic. The carrier plate 610, the resistor plate 620 and the electrode structure 630 may be laminated with a proper adhesive. For example, the adhesive may be a heat-dissipating film made of a mixture of epoxy resin and glass fiber, which functions for heat conduction as well as adhesion between the carrier plate 610 and the resistor plate 620, and adhesion between the carrier plate 610 and the electrode structure 630. The capability of the carrier plate 610 of supporting the resistor plate 620 makes the modification of the resistor plate 620 for resistance adjustment less difficult. A first aperture 612, a second aperture 622, a third aperture 632 and a fourth aperture 642 are created at four sides of the resistor for positioning purpose, and a slit 601 is disposed inside the fourth aperture 642 for fine-tuning resistance. Meanwhile, the carrier plate 610 remains unremoved in the four apertures 612, 622, 632 and 642. Preferably, the slit 601 is created into the bottom of the aperture 642 by way of laser cutting. Since the resistance of the resistor will vary with the length of the slit 601, the size of the slit 601 is determined according to the resistance level to be reached. The positions and sizes of the apertures should be well selected so as to reach a target value of resistance with minimized measurement and adjustment repetitions.

The electrode structure 630 includes an electrode layer 6301 provided onto a face 6201 of the resistor plate 620 by way of electroplating, and an auxiliary layer 6302 electroplated or adhered onto the carrier plate 610 disposed on an opposite face 6202 of the resistor plate 620. The auxiliary plate 6302 is a metal layer, e.g. a copper layer, functioning for heat dissipation from the resistor 600 and preventing the structure from warping. A protective layer 67 is then formed on the surfaces of the resistor plate 620 uncovered by the electrode structure 630, and a soldering layer 65 is formed as overlying the electrode structure 630.

Figure 6D:
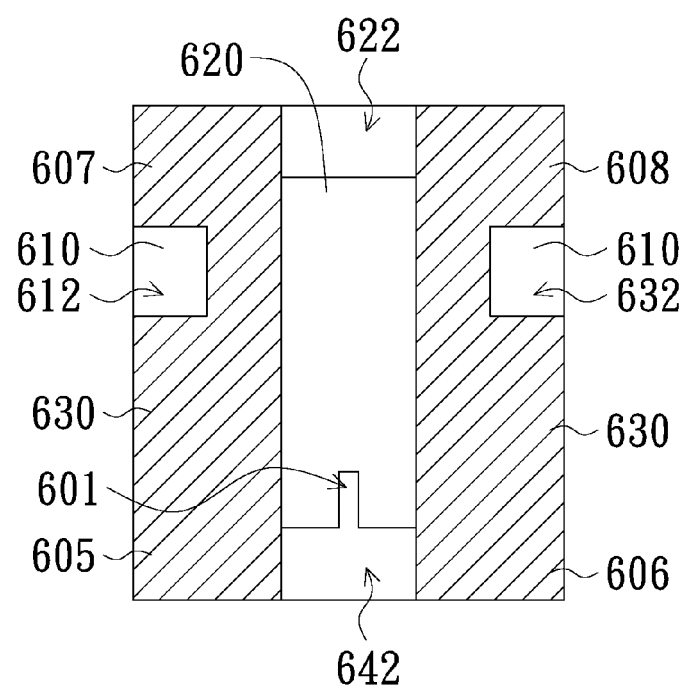
FIG. 6D is a top plane view schematically illustrating a partial structure of the resistor device as shown in FIG. 6A, before the soldering layer is applied.
Figure 6E:
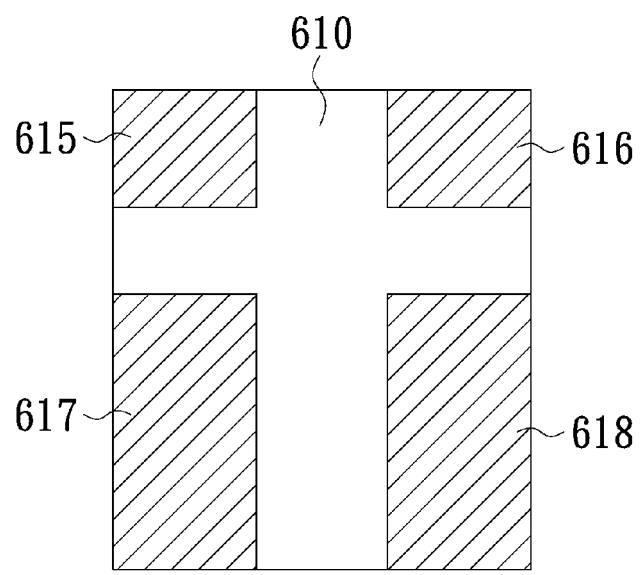
FIG. 6E is a bottom plane view schematically illustrating a partial structure of the resistor device as shown in FIG. 6A, before the soldering layer is applied.

Furthermore, it can be seen from FIG. 6C that the electrode structure 630, the resistor plate 620, the carrier plate 610 and the protective layer 67 in the aperture 632 are exposed from the soldering layer 65. Likewise, the electrode structure 630, the resistor plate 620, the carrier plate 610 and the protective layer 67 in the aperture 612 are also exposed from the soldering layer 65. Similar to the embodiment described with reference to FIGS. 4A-4E, the current pads 605, 606 and the sensing pads 607, 608 of the electrode structure 630 are physically interconnected, as illustrated in FIG. 6D, for the Kelvin measurement, and isolated auxiliary blocks 615, 616, 617 and 618 is particularly made, as illustrated in FIG. 6E, to avoid the Kevin measurement from being interfered due to undesired current flows among those blocks.

In any of the above embodiments, the resistor plate can be made of a resistive material, e.g. an alloy or a compound of manganese-copper, nickel-copper or nickel-phosphorus. The apertures can be created by way of etching or punching. The material respectively for the electrode and the auxiliary layer disposed at opposite sides of the resistor plate can be the same or different. The soldering layer may be a composite layer sequentially formed of copper, nickel and tin sub-layers by way of electroplating or sputtering. Alternatively, the soldering layer can be a composite layer made of, but are not limited to the material of, silver, platinum, solder, etc., depending on practical requirements. Optionally and preferably, the soldering layer may include an additional layer (not shown) formed beside the stacked structure of the resistor plate 620 and the carrier plate 610, before the formation of the composite layer, for improving adhesion of the composite layer to the stacked structure. The additional layer may be applied by barrel plating, and extend from the electrode layer 6301 to the auxiliary layer 6302. For avoiding undesired current flows among the blocks, the additional layer should also be partially removed as the composite layer is. The protective layer can be made of epoxy resin, which is not only used for protection but also functions for strengthening the structure. It is to be noted that the soldering layer and the protective layer are desirable but not essential to the implementation of the present invention.

Figure 7A:
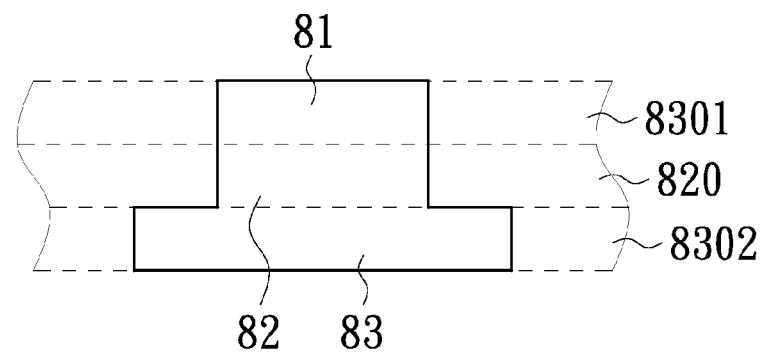
FIG. 7A is a schematic diagram illustrating an alternative configuration of one of the apertures in the above-described embodiments.
Figure 7B:
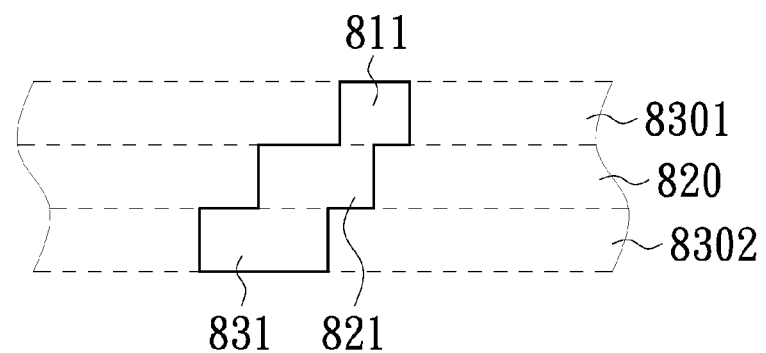
FIG. 7B is a schematic diagram illustrating a further alternative configuration of one of the apertures in the above-described embodiments.

Please refer to FIG. 4C, FIG. 5C, FIG. 6C and FIG. 7 again. In each of the above embodiments, the configuration of the electrode layer and the auxiliary layer conform to the shape of the resistor plate, and the electrode layer and the auxiliary layer have conformable aperture sizes and positions. Alternatively, the aperture sizes and positions can be varied as long as the undesired current flows among the auxiliary blocks can be effectively blocked by the apertures. For example, as illustrated in FIG. 7A, the auxiliary layer 8302 has a side opening 83 wider than the side openings 82 and 81 of the resistor plate 820 and the electrode layer 8301. It may be rendered due to reduced sizes of the separated blocks of the auxiliary layer 8302. The openings 81, 82 and 83 are combined as one of the apertures described in the above embodiments, which is depicted with solid lines. In another example, respective openings 811, 821 and 831 of the electrode layer 8301, the resistor plate 820 and the auxiliary layer 8302 are combined as one of the apertures described in the above embodiments, as illustrated in FIG. 7B. In this example, the openings 811, 821 and 831 are staggered from one another but partially overlapped. In spite of only partially overlapping, the undesired current flow among the blocks can be effectively cut off.

In alternative examples, the side opening of the auxiliary layer can be made narrower as a result of enlargement of the sizes of the separated blocks or wider as a result of reduced sizes of the separated blocks.

Furthermore, in spite it is exemplified in the above embodiments that the auxiliary layer includes four separate blocks, an auxiliary layer including more or less than four separate blocks is also proper according to the present invention as the purpose of blocking undesired current flows can be achieved. Desirably, the material of the auxiliary layer is selected to further function for supporting the resistor structure and/or dissipating heat.

The principle of the present invention is also applicable to a conventional resistor device, in which no aperture is created in the resistor plate. In this example, no aperture is created in the electrode layer, either, but the auxiliary blocks are still separated for achieving the purpose of avoiding undesired current paths. Preferably, the resistor plate and electrode layer have respective lateral surfaces partially exposed from a subsequently applied soldering layer. The exposed portions of the resistor plate and electrode layer are located corresponding to the position of the gap between the separated blocks of the auxiliary layer for further blocking undesired current flows.

While the invention has been described in terms of what is presently considered to be the most practical and preferred embodiments, it is to be understood that the invention needs not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A resistor device, comprising:
   a resistor plate; and
   an electrode structure including:
      an electrode layer disposed at a first face of the resistor plate and including a first portion and a second portion overlying a first side and a second side of the resistor plate, respectively, wherein the second side is opposite to the first side, and a current path is conducted between the first portion and the second portion through the resistor plate; and
      an auxiliary layer disposed at a second face of the resistor plate, which is opposite to the first face, and including at least a first block and a second block overlying the first side of the resistor plate, and at least a third block overlying the second side of the resistor plate, wherein the first, second and third blocks of the auxiliary layer are separated from one another so that any current flow among the blocks is blocked.

2. The resistor device according to claim 1, wherein the first, second and third blocks of the auxiliary layer are isolated from one another with a protective layer.

3. The resistor device according to claim 1, further comprising a soldering layer overlying the electrode layer and the auxiliary layer, and partially covering a third face of the resistor plate.

4. The resistor device according to claim 3, wherein the resistor plate is recessed on the third face so as to have an opening at the first side; the electrode layer has an opening with a size and a position corresponding to the opening of the resistor plate; and the auxiliary layer has an opening, which is rendered from a gap between the first block and the second block, with a size and a position corresponding to the opening of the resistor plate.

5. The resistor device according to claim 4, wherein the openings of the electrode layer, the resistor plate and the auxiliary layer combine to form a first aperture where the resistor plate and the auxiliary layer are exposed from the soldering layer.

6. The resistor device according to claim 5, further comprising a carrier plate between the resistor plate and the auxiliary layer for supporting the resistor plate, wherein the carrier plate in the first aperture is exposed from the soldering layer.

7. The resistor device according to claim 5, wherein the resistor plate has another opening at the second side; the electrode layer has another opening with a size and a position corresponding to another opening of the resistor plate; the auxiliary layer has another opening, with a size and a position corresponding to the another opening of the resistor plate; and the openings of the electrode layer, the resistor plate and the auxiliary layer at the second side combine to form a second aperture where the resistor plate and the auxiliary layer are exposed from the soldering layer.

8. The resistor device according to claim 7, wherein the auxiliary layer further includes a fourth block overlying the second side of the resistor plate, and the another opening of the auxiliary layer is rendered from a gap between the third block and the fourth block.

9. The resistor device according to claim 4, wherein the openings of the electrode layer, the resistor plate and the auxiliary layer have substantially equal widths and are aligned with one another.

10. The resistor device according to claim 4, wherein the openings of the electrode layer and the auxiliary layer have different width.

11. The resistor device according to claim 4, wherein the openings of the electrode layer and the auxiliary layer are staggered from but partially overlap with each other, and the partially overlapping openings of the electrode layer and the auxiliary layer further partially or completely overlap with the opening of the resistor plate.

12. The resistor device according to claim 3, wherein the soldering layer has a gap on the third face of the resistor plate, which has a size and a position corresponding to a gap between the first block and the second block of the auxiliary layer.

13. The resistor device according to claim 1, wherein the resistor plate has a third aperture at a third side and a fourth aperture at a fourth side opposite to the third side.

14. The resistor device according to claim 13, wherein the resistor plate has a slit inside the fourth aperture for fine-tuning resistance of the resistor plate.

15. The resistor device according to claim 1, wherein the first portion and the second portion of the electrode layer are isolated from one another with a protective layer.

* * * * *